United States Patent [19]

Cunningham, Jr. et al.

[11] Patent Number: 4,512,841
[45] Date of Patent: Apr. 23, 1985

[54] RF COUPLING TECHNIQUES

[75] Inventors: George F. Cunningham, Jr., Essex; John W. Lewis, Colchester; Robert B. McClure, Essex Junction; Daniel J. Poindexter, South Burlington, all of Vt.

[73] Assignee: International Business Machines Corporation, Armonk, N.Y.

[21] Appl. No.: 596,189

[22] Filed: Apr. 2, 1984

[51] Int. Cl.³ ............... B44C 1/22; C03C 15/00; C03C 25/06
[52] U.S. Cl. ............... 156/345; 156/643; 156/646; 204/298
[58] Field of Search ............... 156/643, 646, 345; 204/164, 192 E, 298; 219/121 PD, 121 PE, 121 PF, 121 PG; 313/231.31, 329; 118/500, 503, 728

[56] References Cited

U.S. PATENT DOCUMENTS

| | | | |
|---|---|---|---|
| 4,222,839 | 9/1980 | Goodner et al. | 204/192 E |
| 4,230,515 | 10/1980 | Zajac | 156/345 |
| 4,297,162 | 10/1981 | Mundt et al. | 156/643 |
| 4,298,443 | 11/1981 | Maydan | 204/192 E |
| 4,307,283 | 12/1922 | Zajac | 219/121 PG |
| 4,309,267 | 1/1982 | Boyd et al. | 204/298 |
| 4,400,235 | 8/1983 | Coquin | 156/345 X |
| 4,439,261 | 3/1984 | Pavone et al. | 156/345 |

OTHER PUBLICATIONS

IBM Technical Disclosure Bulletin, vol. 13, #5, Oct. 1970, p. 1296, Y. Budo et al.

*Primary Examiner*—William A. Powell
*Attorney, Agent, or Firm*—Francis J. Thornton

[57] ABSTRACT

An improved reactive ion plasma etching apparatus having an improved electrode, for holding the product, such as a semiconductor wafer, to be etched, provided with a plurality of apertures into which different tailored product holders are inserted so as to alter the plasma over each holder and provide more uniform etching of the product in the holder regardless of its position on the electrode.

19 Claims, 10 Drawing Figures

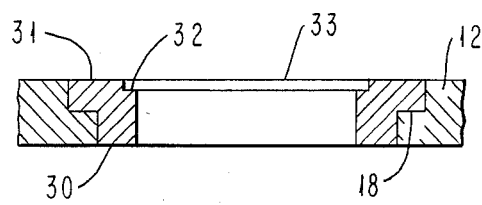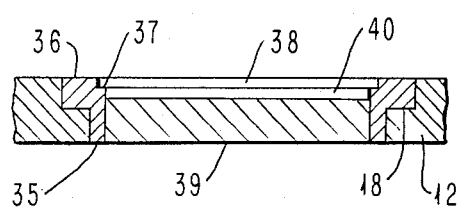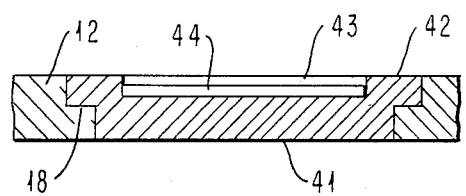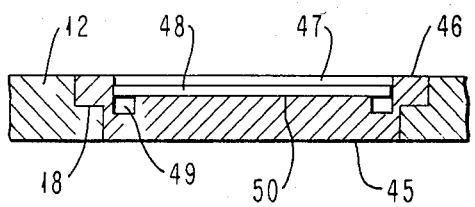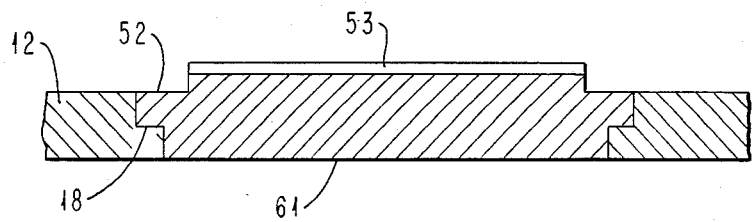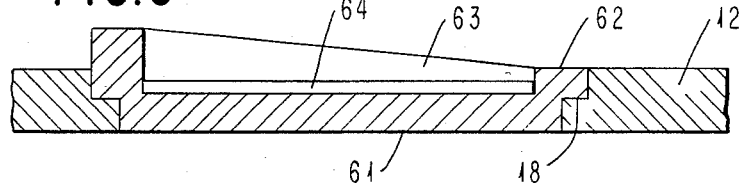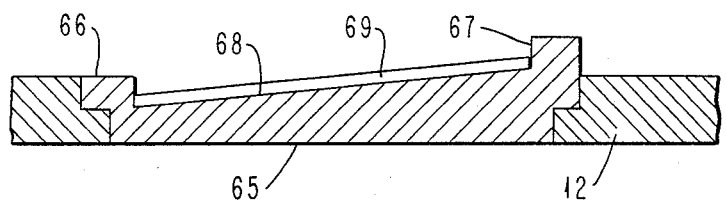

4,512,841

RF COUPLING TECHNIQUES

FIELD OF THE INVENTION

The present invention relates generally to plasma etching techniques and more particularly to an improved plasma etching apparatus electrode structure.

BACKGROUND OF THE INVENTION

Plasma etching techniques have been widely used for etching products such as semiconductor wafers. Basically such a technique comprises the exposing of wafers to a plasma to remove surface materials, such as silicon oxide, carried on the semiconductor wafer surface. These plasma etching techniques are used in the semiconductor industry because the plasma etching process involves low temperatures. Low temperatures are realized because the power required to generate the plasma is low. Because the process uses low temperatures the use of photoresist as a mask material is permitted. Also, because plasma etching is fundamentally a chemical process, selectivity in etching is very high and mask erosion can be made minimal.

The difficulty with such etching is non-uniformity of the species forming the plasma with respect to the material being treated. This is caused, in part by electrical field variations between the cathode and the anode.

Traditionally the products to be etched, such as wafers, are batch etched, that is they are evenly spaced upon one electrode of the plasma etching machine and exposed to the plasma. Because large numbers of wafers can be treated at once in such batch etchers they are the preferred production etching tool even though the poor uniformity realized in such tools requires considerable tradeoffs in device size, tolerances, etc. Although such batch etching increases the throughput it has been found that because of the gas flow, temperature, electric fields, plasma formation, etc. in the usual apparatus the plasma affects each wafer, in the batch, differently depending on its location in the apparatus. Thus the rate of and amount of etching realized by each wafer depends significantly on the wafers position on the electrode. In general, the etching rate varies with the radial position of the wafer on the electrode. Thus batch etched wafers are non-uniformly etched.

This problem of non-uniformity has been addressed in the past by; selectively spacing the wafers from the electrode with quartz spacers; providing extension shields around the entire electrode in an attempt to even out the dark space over the electrode; curving the electrode surface and by; altering the distribution of the plasma forming gas flow within the apparatus.

Even with these solutions, in the prior art considerable etching uniformity problems were encountered and batch uniformity was found to range 18% to 25% with the central wafers etching faster than the wafers positioned around the edges of the electrode.

Thus the solutions discussed above did not provide significant improvements to the etching uniformity problem and until the present invention the best uniformity between wafers was achieved only when each wafer was etched individually, for example, in a single wafer etcher. Such single wafer etchers have a very low throughput and therefore are expensive to use and have such a low output that their use as a production tool is economically discouraged.

SUMMARY OF THE INVENTION

The present applicants have now found that by providing a batch plasma etcher with a unique electrode that a heretofore unattainable etching uniformity can be achieved while achieving the high throughput of the batch etchers.

This significant improvement in etching uniformity is realized by providing the wafer carrying electrode, in the etching apparatus, with a plurality of apertures and inserting in each aperture a tailored product holder. Each such holder is tailored, with respect to its geographic location on the electrode, so that the characteristics of the plasma, immediately surrounding each product contained in the holder, is modified to be substantially identical to that surrounding any other product contained in any other holder. Furthermore, each holder can be tailored to compensate not only for the differences in its geographical location on the electrode but can be tailored to compensate for film abnormalities such as film thickness differences that may be on the surface of the product in the holder.

OBJECTS OF THE INVENTION

It is an object of the invention to improve etching uniformity in plasma etchers by compensating for the plasma field or chamber abnormalities.

It is another object of the present invention to compensate etching variation due to the differences in the films deposited on the product being treated in the etcher.

It is still another object of the present invention to provide individual treatment of each of the product deposited on a batch plasma etching electrode.

It is a further object of the present invention to provide a plasma etching apparatus in which any product placed therein can be etched at substantially the same rate regardless of its position within the plasma etching apparatus.

It is still a further object of the invention to assure uniformity of etching across the surface of any individual product regardless of the size of the wafer being etched.

These and other objects and features of the present invention will become further apparent from the following description taken in conjunction with the drawings.

BRIEF DESCRIPTION OF THE DRAWINGS

FIGS. 4, 5, 6, 7, 8, 9 and and 10 all show cross sectional views of various wafer holders for use with the electrode of FIG. 2.

DESCRIPTION OF THE PREFERRED EMBODIMENT

The present invention solves the uniformity problems encountered in the past by forming the electrode of the apparatus with a plurality of apertures into which a plurality of product holders can be inserted. It should be understood that depending on the apparatus, biasing, etc. the electrode can be either the anode or the cathode of the apparatus. These holders assure both good electrical and thermal contact to the product contained therein but are also designed to physically modify the characteristics of the plasma within the vicinity of the holder. The holder configuration can also be altered to take into consideration the type of film being removed as well as the geographic location of the holders within the reactor.

Figure 1:
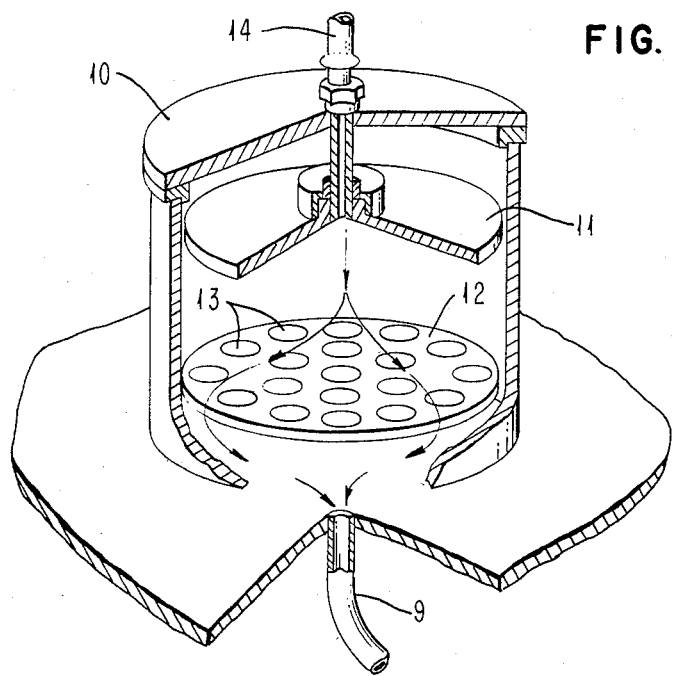
FIG. 1 is a cross sectional view of a batch plasma etching apparatus.

As shown in FIG. 1 a cross sectional view of a typical batch type, parallel plasma etcher is shown. Basically such plasma etchers comprise a chamber 10 containing an upper electrode 11, and a lower electrode 12 which is carrying a plurality of semiconductor wafers 13. In the configuration shown, electrode 11 is the cathode and electrode 12 is the anode and both are coupled to an R-F source (not shown). A plasma forming gas is introduced via tube 14 through the center of cathode 11 into the chamber 10 and between the electrodes 11 and 12. With such a gas in the chamber 11 a plasma is formed between the electrodes 11 and 12 when the RF source is turned on. Plasma forming gas is extracted from the chamber 10 via outlet tube 9 which is coupled to a vacuum pump (not shown). Such etching apparatus is presently commercially available and need not be further discussed.

It should be noted that although FIG. 1 shows a chamber with a top gas inlet and a bottom outlet that side inlet and outlet chambers can also be used.

Figure 2:
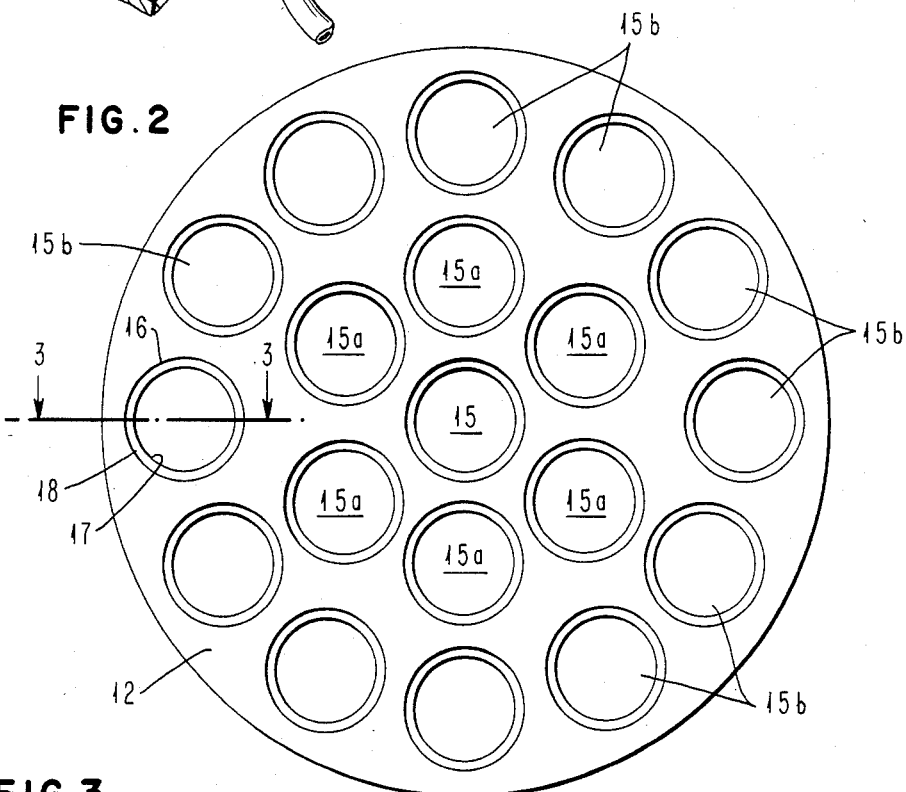
FIG. 2 is a top view of the electrode of the apparatus of FIG. 1 formed according to the present invention.
Figure 3:
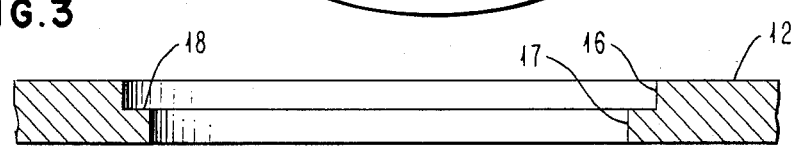
FIG. 3 shows an enlarged, partial, sectional view of the electrode of FIG. 2 taken along the lines 3—3.

The anode 12 of FIG. 1, designed in accordance with the present invention, is shown in greater detail in FIGS. 2 and 3. In FIG. 2 a top view of the anode is shown. This anode typically, when designed for use with semiconductor wafers about 3¼ inches in diameter, comprises a substantially flat circular plate, about 0.25 inches in thickness, having a diameter of about 26 inches.

It should, of course be understood that the diameter and thickness of such electrodes will vary depending on the machine in which they are to be used and with the diameters of the wafers to be treated. Such variations and modifications are, of course, well within the art and need not be further explained here.

For the sake of convenience of description herein however, it will be assumed that only 3.25 inch semiconductor wafers are being used.

In accordance with the present invention the electrode 12, as shown in FIG. 2, has a plurality of apertures therein. These apertures are arranged in arrays, usually as a series of concentric rings. In the electrode shown, a central aperture 15 is surrounded by two concentric rings of apertures 15a and 15b respectively. All of these apertures are identical to one another and each has a stepped inner wall as especially shown in FIG. 3. The larger diameter 16 of the aperture is approximately 3.75 inches while the smaller diameter 17 is about 3.25 inches. Thus a 0.25 inch shoulder 18 is provided for in each aperture.

Different wafer holders suitable for insertion in the electrode of FIG. 2, are shown in FIGS. 4 through 8.

FIG. 4 illustrates a holder formed as a ring 30 with an exterior extended lip 31 and an inner recessed shoulder 32 which supports a wafer 33. The wafer 33 is supported so that its upper surface is in the plane of the upper surface of the holder 30. The lip 31 is of suitable thickness and shape to mate with the shoulder 18 of the electrode 12 so as to support the ring 30 in any one of the apertures 15, 15a or 15b in electrode 12 so that the upper surface of the ring 30 is in the plane of the surface of the electrode 12.

FIG. 5 illustrates another wafer holder. In this instance the holder comprises a ring 35 formed with an extended lip 36 and provided with an inner recessed shoulder 37 into which a wafer 38 can be set. The lip 36 and the recess 37 are of sufficient thickness and depth respectively to assure that the upper surfaces of the ring 35, the wafer 38 and the electrode 12 are all in the same plane. The bottom central interior of the ring 35 is filled in with an insert 39 which extends from the bottom of the ring 35 to a level below that of the wafer 38 so that a space 40, approximately equal to the thickness of the wafer 38 is left between the bottom of the wafer 38 and the upper surface of the insert 39. This insert can be either conductive or insulating although a conductive insert is usually preferred.

FIG. 6 shows a wafer holder formed as a recessed dish 41 having an extended lip 42 and a central recess 43. Again the thickness of the lip is such that the top of the holder is in the plane of the electrode 12. The depth of the recess 43 is at least twice the thickness of the wafer 44 which is placed therein so that it rests on the bottom of the dish thus the surface of the wafer 44 sits in the dish and is beneath the plane of the electrode 12 when the holder is placed in the electrode 12.

FIG. 7 shows a holder that is quite similar to the holder shown in FIG. 6 and comprises a recessed dish 45 having an extended lip 46, and a central recess 47, whose depth is twice the thickness of the wafer 48, placed therein. In addition the recess 47 is provided with a groove 49 encircling its outer edge so that a central pedestal 50 is created in the center of the dish. This groove 49 should preferably have a depth at least equal to the thickness of the wafer. This causes the outer edge of the wafer 48 is cantilevered from the central pedestal 50.

It should be noted that each of the holders shown in FIGS. 4, 5, 6, and 7 could be modified so that the lip extends above the surface of the plane of the electrode.

FIG. 8 shows a mesa type holder. This holder comprises a central body 61 provided with an extended lip 52 which rests on the shoulder 18 in the electrode 12. In this figure the body 61 is of such a thickness that it extends above the plane of the upper surface of the electrode 12 as a mesa and thus supports the wafer 53 above the plane of the upper surface of the electrode 12.

FIG. 9 shows a holder that comprises a recessed dish 61 provided with an exterior lip 62 and a central recess 63 into which a wafer 64 can be inserted. The central recess 63 is provided with a flat bottom parallel to the upper surface of the electrode 12. The lip 62 is provided with an upwardly extending rim of variable thickness. By varying the thickness of the rim from one side of the holder to the other the plane of the upper surface of the rim 61 is at an angle to the plane of the upper surface of the electrode 12, thus the rim 62, on one side, extends above the upper surface of the electrode 12 while on the other side is substantially at the same level as the surface of the electrode 12.

FIG. 10 shows a variation of the beveled holder of FIG. 9. Here the wafer holder 65 is provided with an extended lip 66 and a central recess 67 into which a wafer 69 can be inserted. The central recess 67 has a flat bottom 68 set at an angle with respect to the upper surface of the electrode 12. Again the lip 62 is provided with a rim of variable thickness. Again by varying the thickness of the rim from one side of the holder to the other, the plane of the upper surface of the rim is again at an angle with the plane of the upper surface of the electrode 12. Preferably, the bottom of the recess 67 is maintained at the same angle as the plane of the upper surface of the rim 66 with respect to the surface of the electrode 12 and slightly below the surface of the rim.

Initially, samples were run using electrodes loaded with each of the different shaped wafer holders shown in FIG. 4 thru 7. With a plasma tool operating at 1275 watts, a gas flow of 90 sccm, 100% $O_2$ at 60 millitorr at 20° C., and a photo resist and polyimide coating on each wafer in each holder the average, within wafer uniformity, for electrodes loaded with each type of wafer holder shown in FIGS. 4, 5, 6 and 7 is set forth below.

The average within wafer uniformity for an electrode loaded with the holder shown in FIG. 4 was 13.1%. Wafer uniformity as used herein means that uniformity measured using 5 points per wafer and with the result published as 3 sigma/$\bar{x}$ information.

When the holders were changed to the shape shown in FIG. 5 the within wafer uniformity was improved to 12.1%.

The substitution of the holder shown in FIG. 6 resulted in still a further improvement in uniformity of to 9.7%. Holders as shown in FIG. 7 did not appreciably change the result and a wafer uniformity of 10% was achieved. Because the holder shown in FIG. 6 resulted in the lowest within wafer uniformity, this was chosen for further tests.

When the holder, shown in FIG. 6, was employed it was found that the within wafer uniformity on the inner central positions, 15 and 15a of FIG. 1, was 10% or less but at the outer positions, 15b of FIG. 1, the wafer uniformity averaged 15.8%. This indicated that wafers in the outer positions 15b were being etched at a faster rate than those wafers placed in the inner positions 15 or 15a. Further tests also determined that if the surface of the wafer was set at a depth of approximately 0.125 inches below the surface of the holder a wafer uniformity of approximately 2.3% in the inner positions 15, and 15a was obtained and a wafer uniformity of 7% realized in the outer positions 15b. Still further tests determined that the batch rate uniformity of the outer positions 15b was further improved if the beveled holder shape of FIG. 8 were used. In this holder the depth of the wafer surface ranged from 0.125 inches to 0.200 inches at the outer edge that the wafer uniformity in these outer positions 15b averaged to 4.2%.

These differences in etching uniformity can better be understood from the following discussion. Generally these fall into four categories, which are:

(1) Center area of the wafer etching faster than the outer edge.

(2) Outer edge of the wafer etching faster than the center area.

(3) A portion of the outside edge etching faster than the remainder of the wafer.

(4) The areas of the electrode near the electrode edges etching faster than the remainder of the electrode.

Combinations of these effects can also occur. To combat these maladies the basic wafer holder designs set out in FIG. 4 to 10 are used.

The holder design of FIG. 6 is used to solve both effects 1 and 2 above. The deeper the recess 43 the slower the outside edge of the wafer 44 etches, due to protection by the lip 42. Another added feature of the design shown in FIG. 6 is, by decreasing the depth of the recess 43 the wafer 44 the etch rate across the whole wafer is increased slightly and by deepening the recess, the etch rate of the wafer is decreased. Alternately if the wafer is not recessed but instead is raised above the surface of the electrode by the mesa configured holder, as shown in FIG. 8, the outside edge of the wafer 53 will etch faster. With this knowledge one can populate an entire electrode with holders having different depths of recess or different height of mesa for improved batch uniformity.

The holder design of FIG. 7 can especially be used to improve center etch rates due to better RF coupling in this region, this corrects effect number 2. The holder design of FIG. 5 is used to increase etch rate on the outer edge of the wafer due to better RF coupling, thus curing effect number 1. Both of these holder designs are susceptible to heat transfer problems. The areas of the wafer not contacting the thermally conductive pedestal tend to heat up during the etch causing some films to etch at different rates. This can be corrected by adding a heat transfer medium, which insulates electrically, to these areas of the wafer.

The holder designs shown in FIG. 9 and 10 are best used to correct effects number 3 and number 4 above. Usually these effects are brought on by effects from the electrode edge. These edge effects generally cause the portion of the wafer closest to the electrode edge to etch faster than the remainder of the wafer. By using the design of FIG. 9, in which the rim of the pedestal is raised higher on one side than the other, usually about 0.35 inches, one can compensate for the edge effect. The holder is preferably positioned in the electrode so that the high side of the rim will be closest to the outermost electrode edge, thereby protecting the outside edge of the wafer more. The holder design, shown in FIG. 9, keeps the wafer surface parallel with the electrode surface. As noted the modified design of FIG. 10 actually tilts the wafer with respect to the surface of electrode 12.

There are basic differences in plasma etching and reactive ion etching (RIE). RIE is a directional etch while plasma etching is generally not. Therefore in order to have sidewalls etched straight down in RIE one must have the wafer parallel to the electrode surface, i.e., the design as shown in FIG. 9. However plasma etching being non-directional allows the wafer to be tilted so that the raised area of the wafer, as shown in FIG. 10, can be positioned closer to the upper electrode and etched to a greater extent. By using either the design shown in FIG. 9 or FIG. 10 one can effectively cancel the edge effects found on the outermost ring of apertures on electrode 12 and procure the best results regardless of the type of etching being performed.

It should be understood that another factor to be considered in creating an electrode with an optimum holder is to consider the material from which the holder is to be formed, for the material can alter the RF field and affect the desired effects. For example, the holders can either be coated with or formed of an insulating material to improve uniformity of the etching of the wafer. Thus by surrounding the wafer with a holder of volatile substance, chosen so that it etches at the same rate as the wafer film assists in correcting effect number 2 described above.

Thus this invention teaches that by using an apertured electrode and placing in the apertures product holders of selected designs that uniform etching of the product can be realized regardless of the product position in the apparatus.

This occurs because each holder controls the etching uniformity of the product contained therein by altering the local physical characteristics immediately surrounding the product contained in the holder. The local characteristics around each product is modified according to its own particular needs by suitable design of the holder. These individual holders significantly improve uniformity of product etching on the anode by compensating for both film and reactor chamber abnormalities by physically affecting the local RF field.

Although a batch etcher has been described in detail it should be noted that the modification of the holder, as taught herein, could be used in a single wafer etcher.

It should also be understood that although a flat batch electrode was shown that a curved electrode could also be used but that the shape of holders may require some modification to compensate for the curve of the electrode.

While the invention has been particularly described with respect to a preferred embodiment, it should be understood by one skilled in the art from the foregoing that changes in form and detail my be made without departing from the spirit and scope of the invention.

What is claimed is:

1. In a plasma etching apparatus an improved electrode for holding the product to be etched comprising:
   an electrode plate having a plurality of apertures therein;
   a workpiece holder positioned in each aperture;
   each holder for holding a wafer in a preselected position and being tailored to alter the plasma around and over the holder to provide uniform etching over the surface of the wafer in the holder.

2. The apparatus of claim 1 wherein one of the apertures in said plate is in the center thereof and the remainders form a plurality of arrays around the center of the plate.

3. The apparatus of claim 1 wherein the holders in some of said apertures differ from the holders in other of said apertures.

4. The apparatus of claim 1 wherein some of said holders comprise a body having a recess therein for supporting a wafer in substantially the same plane as the major surface of the electrode.

5. The apparatus of claim 1 wherein some of said holders comprise a body having a recess therein for supporting a wafer substantially parallel to but below the plane of the major surface of the electrode.

6. The apparatus of claim 1 wherein some of said holders comprise a body having a mesa for supporting a wafer substantially parallel to but above the plane of the major surface of the electrode.

7. The apparatus of claim 1 wherein some of said holders comprise a body having a recess therein for supporting a wafer at an angle to the plane of the major surface of the electrode.

8. The apparatus of claim 4 wherein said recess is provided with an inner recessed shoulder for supporting the edge of said wafer such that a cavity is provided in said holder under substantially all of said supported wafer.

9. The apparatus of claim 8 wherein said holder is formed of metal.

10. The apparatus of claim 9 wherein said holder is generally in the form of a ring.

11. The apparatus of claim 9 wherein the center of said ring and a portion of said cavity is filled with a non-metallic material.

12. The apparatus of claim 5 wherein said holder is a substantially flat metallic dish having a recess therein and means for supporting said wafer in said recess.

13. The apparatus of claim 12 wherein said means supports only the center of said wafer in said recess and the edges of said wafer are cantilevered.

14. The apparatus of claim 6 wherein said holder is provided with an outer, tapered rim encircling the recess in which the wafer is supported, said rim being tapered so as to be flush with the major surface of the electrode at one point and extending above said major surface at a point 180 degrees from the point where the rim is flush with said surface.

15. The apparatus of claim 7 wherein said holder is provided with an outer, tapered rim encircling the recess in which the wafer is supported, said rim being tapered so as to be flush with the major surface of the electrode at one point and extending above said major surface at a point 180 degrees from the point where the rim is flush with said surface.

16. The apparatus of claim 3 wherein the aperatures are in concentric rings and the holders, in the outermost concentric ring on said electrodes, are provided with an outer tapered rim encircling the recess in which the wafer is supported, said tapered rim being tapered so as to be flush with the major surface of the electrode at one point and extending above said major surface at a point 180 degrees from the point where the tapered rim is flush with said surface.

17. The apparatus of claim 16 wherein the remainder of the holders comprise a body substantially flush with the surface of the body but having a recess therein for supporting a semiconductor wafer substantially parallel to but below the plane of the major surface of the electrode.

18. The apparatus of claim 16 wherein said outer tapered rim extended about 0.35 inches above the surface of the electrode at its maximum point and said wafer is recessed 0.125 inches below the surface of the electrode.

19. The apparatus of claim 17 wherein said recess is twice the thickness of the wafer supported therein.

* * * * *